(12) United States Patent
Yano

(10) Patent No.: US 7,592,815 B2
(45) Date of Patent: Sep. 22, 2009

(54) LEAKAGE DETECTION CIRCUIT FOR ELECTRIC VEHICLE

(75) Inventor: Jyunya Yano, Kasai (JP)

(73) Assignee: Sanyo Electric Co., Ltd., Osaka (JP)

( * ) Notice: Subject to any disclaimer, the term of this patent is extended or adjusted under 35 U.S.C. 154(b) by 206 days.

(21) Appl. No.: 11/806,807

(22) Filed: Jun. 4, 2007

(65) Prior Publication Data
US 2007/0285057 A1   Dec. 13, 2007

(30) Foreign Application Priority Data
Jun. 8, 2006   (JP) .............................. 2006-159335

(51) Int. Cl.
*G01R 31/14* (2006.01)
(52) U.S. Cl. .................. 324/509; 324/500; 324/522; 320/116; 320/134
(58) Field of Classification Search .............. 320/116, 320/134, 136; 324/500, 509, 522
See application file for complete search history.

(56) References Cited

U.S. PATENT DOCUMENTS 5,438,258 A * 8/1995 Maruyama ................ 324/142
6,731,116 B2 * 5/2004 Yamamoto et al. .......... 324/522
7,026,788 B2 * 4/2006 Yano et al. ................. 320/104

FOREIGN PATENT DOCUMENTS

JP   2003-169401   6/2003
JP   2005-338010   12/2005

* cited by examiner

*Primary Examiner*—Edward Tso
*Assistant Examiner*—Ramy Ramadan
(74) *Attorney, Agent, or Firm*—Wenderoth, Lind & Ponack, L.L.P.

(57) ABSTRACT

A leakage detection circuit for an electric vehicle includes a battery pack, first and second leakage detection switches, a controller, a leakage detection resistor, a voltage detector, and a calculator. The first and second leakage detection switches are connected to the high and low voltage sides of the battery pack, respectively. The battery pack includes a plurality of batteries that are connected in series. The midpoint of the leakage detection resistor is connected to the ground via the first and second leakage detection switches. The controller alternately turns the first and second leakage detection switches ON. Thus, the voltage detector detects leakage voltage values that are generated in the leakage detection resistor. The controller turns the first and second leakage detection switches ON and OFF, respectively, to detect a first leakage voltage value of the leakage voltage values. On the other hand, the controller turning the first and second leakage detection switches OFF and ON, respectively, to detect a second leakage voltage value of the leakage voltage values. Consequently, the calculator detects leakage based on the first and second leakage voltage values.

15 Claims, 6 Drawing Sheets

LEAKAGE DETECTION CIRCUIT FOR ELECTRIC VEHICLE

BACKGROUND OF THE INVENTION

1. Field of the Invention

The present invention relates to a circuit that detects leakage mainly of a charging/discharging circuit of a rechargeable battery, and particularly to a leakage detection circuit for an electric vehicle that detects leakage of a power supply device that powers a motor for running the electric vehicle, such as hybrid car and an electric car.

2. Description of the Related Art

High voltage is required to increase the output of a power supply device for driving an electric vehicle. The reason is that output is proportional to the product of voltage and current. For example, the output voltage of a power supply device for driving a hybrid car or an electric car is very high voltage of 200 V or more. Since, in a high-voltage power supply device, leakage causes a serious harmful effect, the device is not connected to the ground in consideration of safety. In order to prevent leakage, it is necessary for the power supply device that is not connected to the ground to detect a leakage resistance value. The leakage resistance value is a resistance value between the power supply device and the ground. FIG. 1 corresponds to FIG. 1 in Japanese Patent Laid-Open Publication No. 2003-169401, and shows a detection circuit for detecting the leakage resistance value of a power supply device. A leakage detection circuit 50 shown in this Figure has a leakage detection resistor 51, a leakage detection switch 52, and a voltage detection circuit 53 that detects the voltage produced in the leakage detection resistor 51. When a leakage resistance Rr exists, in the state where the leakage detection switch 52 is turned ON, a current flows through the leakage detection resistor 51. Accordingly, detection of the voltage of the leakage detection resistor 51 can detect leakage.

However, it is difficult for the leakage detection circuit shown in FIG. 1 to accurately calculate the leakage resistance value. The inventor has developed a leakage detection circuit shown in FIG. 2 to solve this disadvantage (see Japanese Patent Laid-Open Publication No. 2005-338010).

The leakage detection circuit shown in FIG. 2 includes a battery pack 70, leakage detection resistors $R_a$ and $R_b$, a voltage detector 72, and voltage detection circuits 73. The battery pack 70 includes a plurality of batteries 71 that are connected to each other in series. Each of the leakage detection resistors $R_a$ and $R_b$ is connected in series between the ground, and each of any two high and low voltage side terminal points in the batteries 71. The voltage detector 72 detects the voltage values of the battery terminals on the high and low voltage sides as $V_{g11}(t)$ and $V_{g12}(t)$, respectively, at timing t. Each of leakage detection switches $SW_1$ and $SW_2$ is connected in series between the leakage detection resistors $R_a$ and $R_b$. One of the voltage detection circuits 73 detects a voltage value $V_{l1}(t)$ that is produced in the leakage detection resistor $R_a$ that is connected to the leakage detection switch $SW_1$, when one leakage detection switch $SW_1$ that is connected to the battery terminal on the high voltage side is closed and the other leakage detection switch $SW_2$ is opened at timing t. The other voltage detection circuit 73 detects a voltage value $V_{l2}(t)$ that is produced in the leakage detection resistor $R_a$ that is connected to the leakage detection switch $SW_2$, when the other leakage detection switch $SW_2$ that is connected to the battery terminal on the low voltage side is closed and the one leakage detection switch $SW_1$ is opened at timing t. In addition to this, the leakage detection circuit further includes a leakage calculator 74 that calculates the combined value $R_I$ of the leakage resistors based on following Equation 1.

$$R_I = \frac{R_a}{\dfrac{V_{l2}(t_2)}{V_{g11}(t_2) - V_{g12}(t_2)} - \dfrac{V_{l1}(t_1)}{V_{g11}(t_1) - V_{g12}(t_1)}} - (R_a + R_b) \quad \text{Equation 1}$$

where $t_1$ and $t_2$ are different time values t.

According to this construction, it is possible to easily obtain the leakage resistance value $R_I$, and to calculate the leakage resistance value $R_I$ of the whole circuit even if leakage occurs at two or more points.

SUMMARY OF THE INVENTION

Although the leakage detection circuit for an electric vehicle shown in FIG. 2 can detect the leakage resistance value $R_I$ in the battery pack 70, the two voltage detection circuits 73 are required. For this reason, this leakage detection circuit has a disadvantage that the circuit structure becomes complicated.

The present invention has been developed for further solving this disadvantage. It is an object of the present invention to provide a leakage detection circuit for an electric vehicle that can detect battery pack leakage by means of only one voltage detector.

To achieve the aforementioned object, a leakage detection circuit for an electric vehicle according to the present invention has the following construction.

The leakage detection circuit for an electric vehicle is a leakage detection circuit for an electric vehicle that detects electric vehicle battery pack leakage. The leakage detection circuit includes a battery pack, first and second leakage detection switches, a controller, a leakage detection resistor, a voltage detector, and a calculator. The battery pack includes a plurality of batteries that are connected to each other in series. The first and second leakage detection switches are connected to the high and low voltage sides of the battery pack, respectively. The controller alternately turns the first and second leakage detection switches ON. The leakage detection resistor is connected to the battery pack via the first and second leakage detection switches. The midpoint of the leakage detection resistor is connected to the ground. The voltage detector detects leakage voltage values in the leakage detection resistor on the high and low voltage sides relative to the ground. The calculator calculates the output of the voltage detector and thus detects leakage. In the leakage detection circuit for an electric vehicle, the controller turns the first and second leakage detection switches ON and OFF, respectively, to detect a first leakage voltage value of the leakage voltage values, and turns the first and second leakage detection switches OFF and ON, respectively, to detect a second leakage voltage value of the leakage voltage values so that the calculator detects leakage based on the first and second leakage voltage values.

A leakage detection circuit for an electric vehicle according to another aspect of the present invention includes a total voltage detector that detects the total voltage value between the high and low voltage sides of the battery pack. In this construction, the calculator detects leakage based on the first and second leakage voltage values, and the total voltage value.

In a leakage detection circuit for an electric vehicle according to another aspect of the present invention, the leakage detection resistor includes first and second voltage detection resistors, and first and second dividing resistors. In this construction, the first and second voltage detection resistors are connected to each other in series. The connection midpoint of the first and second voltage detection resistors is connected to the ground. The first voltage dividing resistor joins the first voltage detection resistor to the high voltage side of the battery pack via the first leakage detection switch. The second voltage dividing resistor joins the second voltage detection resistor to the low voltage side of the battery pack via the second leakage detection switch. In this case, the voltage detector can detect the voltage value between the both ends of each of the first and second voltage detection resistors that are connected to each other in series.

In a leakage detection circuit for an electric vehicle according to another aspect of the present invention, the calculator detects a leakage resistance value $R_l$ based on following Equation 2.

$$R_l = \frac{R_a}{\frac{V_{h(t_1)}}{V_{t(t_1)}} + \frac{V_{g(t_2)}}{V_{t(t_2)}}} - (R_a + R_b) \qquad \text{Equation 2}$$

where $R_a$ is the resistance value of first and second voltage detection resistors; $R_b$ is the resistance value of the first and second voltage dividing resistors; $V_{t(t_1)}$ is the total voltage value of the battery pack at the timing t1 where the first and second leakage detection switches are turned ON and OFF, respectively; $V_{h(t_1)}$ is the first leakage voltage value that is generated in the first voltage detection resistor at the timing t1; $V_{t(t_2)}$ is the total voltage value of the battery pack at the timing t2 where the first and second leakage detection switches are turned OFF and ON, respectively; and $V_{g(t_1)}$ is the second leakage voltage value that is generated in the second voltage detection resistor at the timing t2.

Since the aforementioned leakage detection circuit for an electric vehicle detects leakage voltages at given points by means of one voltage detector, the leakage detection circuit can detect leakage resistance values by using an inexpensive and simple structure so that the electric vehicle can be safely used.

The above and further objects of the present invention as well as the features thereof will become more apparent from the following detailed description to be made in conjunction with the accompanying drawings.

DETAILED DESCRIPTION OF THE PREFERRED EMBODIMENT(S)

Figure 1:
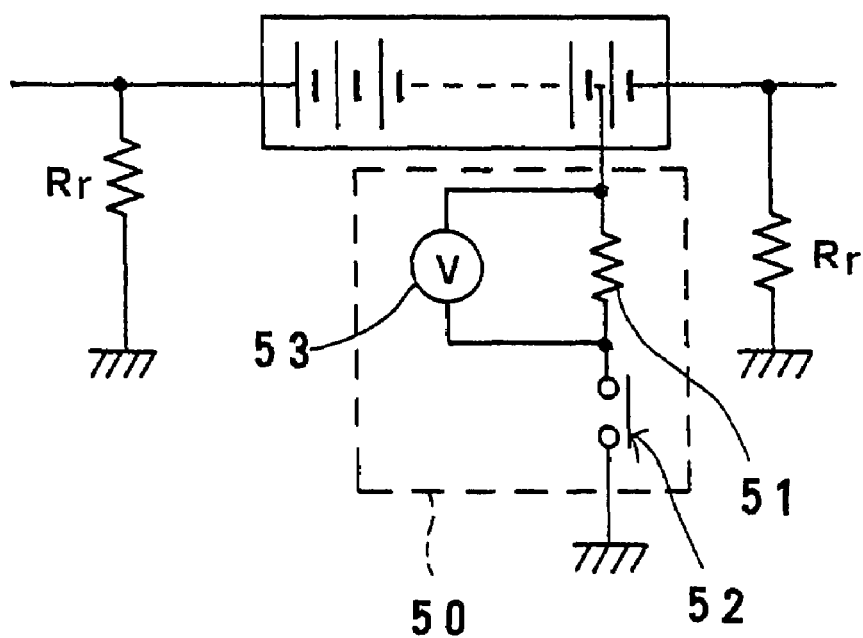
FIG. 1 is a circuit diagram showing one conventional leakage detection circuit.
Figure 2:
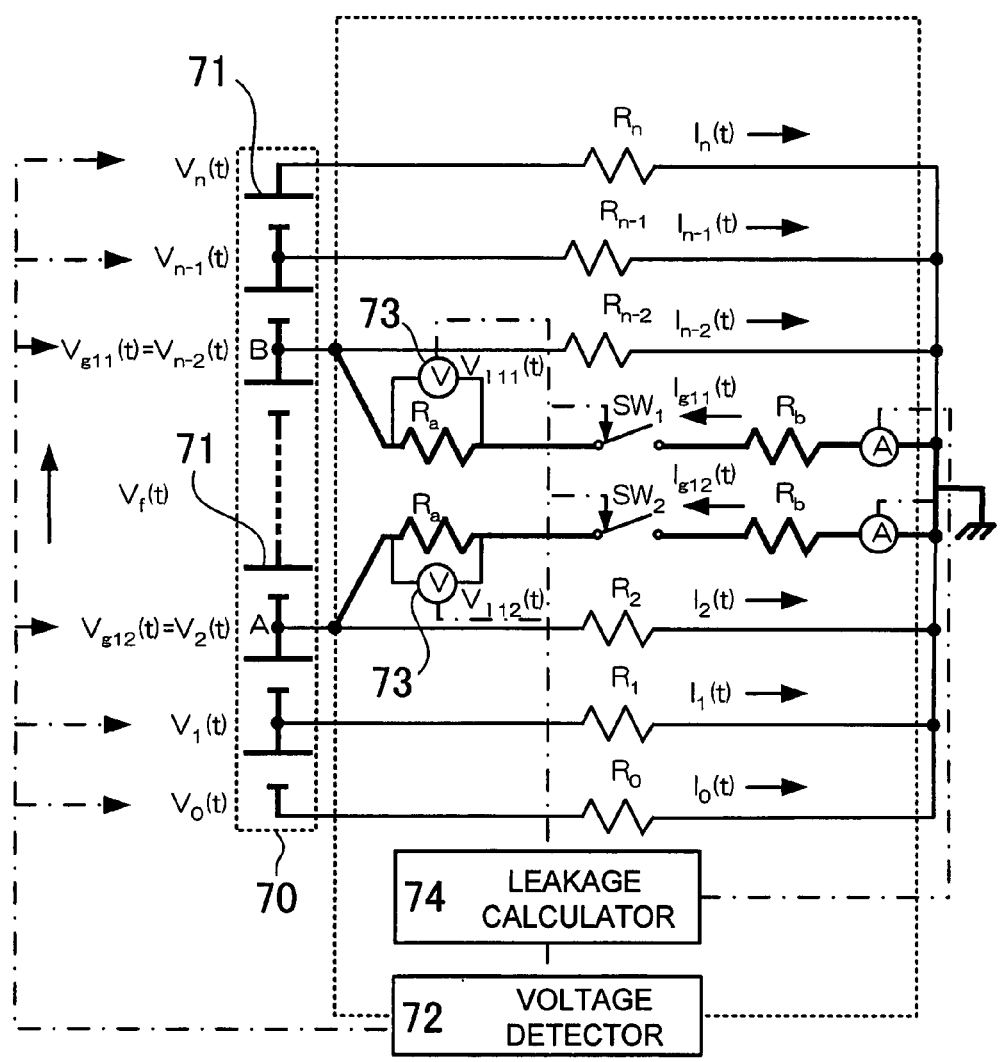
FIG. 2 is a circuit diagram showing a leakage detection circuit that has been developed by the present inventor in advance of the present invention.
Figure 3:
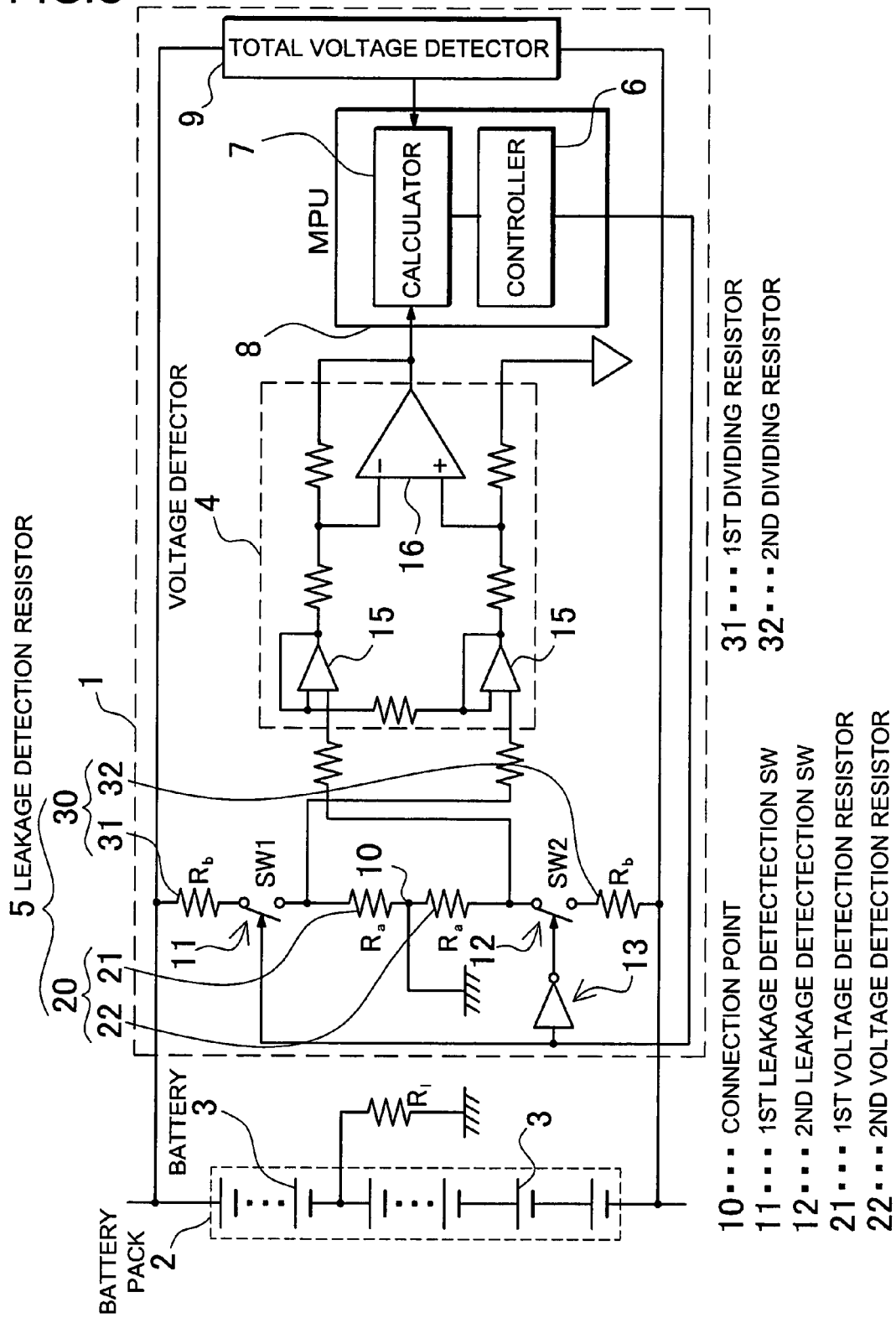
FIG. 3 is a circuit diagram showing a leakage detection circuit for an electric vehicle according to one embodiment of the present invention.

FIG. 3 shows an exemplary leakage detection circuit for an electric vehicle as one embodiment according to the present invention. A leakage detection circuit for an electric vehicle 1 shown in this Figure is added to a battery pack 2 including n batteries 3 that are connected to each other in series. For ease of explanation, a charging/discharging circuit that charges/discharges the battery pack 2 is not illustrated. Each of the batteries 3 is shown as a unit cell in Figure, but may include a plurality of cells that are connected to each other in series or in parallel.

The leakage detection circuit 1 shown in FIG. 3 includes first and second leakage detection switches 11 and 12, a controller 6, a leakage detection resistor 5, a voltage detector 4, and a calculator 7. The first and second leakage detection switches 11 and 12 are connected to the high and low voltage sides of the battery pack 2, respectively. The controller 6 alternately turns the first and second leakage detection switches 11 and 12 ON. The leakage detection resistor 5 is connected to the battery pack 2 via the first and second leakage detection switches 11 and 12. The midpoint of the leakage detection resistor 5 is connected to the ground. The voltage detector 4 detects leakage voltage values in the leakage detection resistor 5 on the high and low voltage sides relative to the ground. The calculator 7 calculates the output of the voltage detector 4 and thus detects leakage.

The leakage detection resistor 5 shown in Figure includes four resistors. The four resistors include first and second voltage detection resistors 21 and 22, and first and second dividing resistors 31 and 32. The first and second voltage detection resistors 21 and 22 are connected to each other in series. The connection midpoint of the first and second voltage detection resistors 21 and 22 is connected to the ground. The first voltage dividing resistor 31 joins the first voltage detection resistor 21 to the high voltage side of the battery pack 2 via the first leakage detection switch 11. The second voltage dividing resistor 32 joins the second voltage detection resistor 22 to the low voltage side of the battery pack 2 via the second leakage detection switch 12. The first and second voltage detection resistors 21 and 22 have the same resistance value $R_a$. The first and second voltage dividing resistors 31 and 32 have the same resistance value $R_b$. However, the first and second voltage detection resistors do not necessarily have the same resistance. In addition, the first and second voltage dividing resistors do not necessarily have the same resistance.

In the leakage detection circuit that includes a series circuit of voltage detection resistors 20 and voltage dividing resistors 30 as the leakage detection resistor 5, the voltage detector 4 receives a voltage between the ends of each of the first and second voltage detection resistors 21 and 22 that are connected to each other in series. In the leakage detection resistor 5, the high and low voltage side voltages are divided by the voltage dividing resistors 30 and the voltage detection resistors 20, and the divided voltages are provided to the voltage detector 4. The divided voltage ratio that is divided by each voltage detection resistor 20 and each voltage dividing resistor 30 is determined by the resistance ratio between each voltage detection resistor 20 and each voltage dividing resistor 30. In the case where the resistance value of the voltage-dividing resistors 30 is large as compared with the voltage detection resistor 20, the divided voltage ratio can be large, in other words, the input voltage for the voltage detector 4 can be small. In this leakage detection circuit, the input voltage absolute value for the voltage detector 4 can be smaller than the high and low voltage side voltage absolute values.

Accordingly, an inexpensive, low-voltage-withstanding amplifier can be used as an amplifier that is used on the input side of the voltage detector 4. However, in the leakage detection circuit according to the present invention, the leakage detection circuit does not necessarily include the voltage detection resistors and the voltage dividing resistors that are connected in series so that the voltage detector receives divided voltages that are obtained by dividing the high and low voltage side voltages.

Each of the first and second leak detection switches 11 and 12 is connected between each of the voltage dividing resistors 30 and each of the voltage detection resistors 20. However, each of the first and second leak detection switches can be connected between each of the voltage detection resistors and the ground. In addition, each of the first and second leakage detection switches can be connected between each of first and second voltage dividing resistors and each of the high and low voltage sides of the battery pack.

The first and second leakage detection switches 11 and 12 are semiconductor switching devices such as a transistor and a FET, or mechanical switches such as a relay. The controller 6 controls ON/OFF switching of the first and second leakage detection switches 11 and 12. One of the first and second leakage detection switches 11 and 12 is turned ON when the other is turned OFF. In other words, the first and second leakage detection switches 11 and 12 are alternately turned ON. In the leakage detection circuit 1 shown in Figure, an inverter 13 that inverts ON/OFF control signals is connected on a control line that controls the second leakage detection switch 12. In this circuit construction, when the controller 6 provides the ON control signal, the first and second leakage detection switches 11 and 12 are turned ON and OFF, respectively. On the other hand, when the controller 6 provides the OFF control signal, the first and second leakage detection switches 11 and 12 are turned OFF and ON, respectively. In this circuit construction, the controller 6 provides one control signal and controls ON/OFF switching of the first and second leakage detection switches 11 and 12.

The voltage detector 4 detects a leakage voltage that is generated in the leakage detection resistor 5 in the state where one of the leakage detection switches is turned ON. The voltage detector 4 shown in Figure detects the leakage voltage at the connection point between each of the voltage detection resistors 20 and each of the voltage dividing resistors 30. The voltage detector 4 shown in Figure includes buffer amplifiers 15 that are connected to the input side, and a differential amplifier 16 that detects the voltage difference between the outputs of the buffer amplifiers 15. The buffer amplifiers 15 are an operational amplifier that uses 100% of negative feedback, and does not provide an amplified output. The differential amplifier 16 is an operational amplifier that has a predetermined gain in accordance with a negative feedback amount. This type of voltage detector 4 is called as an instrumentation amplifier, and amplifies the input voltage difference.

The leakage detection circuit 1 shown in Figure includes an MPU 8 that includes the controller 6 and the calculator 7. The controller 6 provides the control signals that turn the first and second leakage detection switches 11 and 12 ON/OFF. The calculator 7 calculates the leakage voltage value that is provided from the voltage detector 4, and calculates the leakage resistance value $R_I$ based on the following equations. In order to detect the leakage resistance value $R_I$, it is necessary to detect the total voltage value $V_t$ between the high and low voltage side voltages between which the leakage detection resistor 5 is connected. The leakage detection circuit 1 shown in Figure includes a total voltage detector 9 that detects the total voltage value. The leakage detection circuit 1 that thus detects the total voltage value by means of the total voltage detector 9 has a feature that can accurately calculate the leakage resistance value $R_I$. However, the leakage detection circuit does not necessarily includes the total voltage detector. The reason is that the total voltage value can be obtained by the product of the number of the batteries that are connected in series and their battery voltage. Although the battery voltage varies depending on its remaining capacity, the battery voltage varies within a predetermined range. Accordingly, the leakage resistance value can be calculated based on the battery voltage as a constant voltage value. In the case where a vehicle that includes a circuit that detects the total voltage value of the battery pack with the batteries that are connected in series, this circuit can be also used as the total voltage detector.

In the leakage detection circuit 1 shown in Figure, the positive-side and negative-side outputs of the battery pack 2 are set as the high and low voltage sides, respectively. Thus, the output voltage of the battery pack 2 is used as the total voltage value $V_t$ to detect the leakage resistance value $R_I$. For this reason, in a vehicle that includes an output voltage detector, the output voltage detector can be also used as the total voltage detector. In the leakage detection circuit 1 shown in Figure, although the positive-side and negative-side outputs of the battery pack 2 are set as the high and low voltage sides, respectively, a connection point between two batteries among the batteries that are connected in series, that is, a some midpoint in the battery pack can be set as the high or low voltage side to detect the leakage resistance value. In the present invention, the high voltage side of the battery pack is not limited to the positive-side output, and the low voltage side is not limited to the negative-side output.

Figure 4:
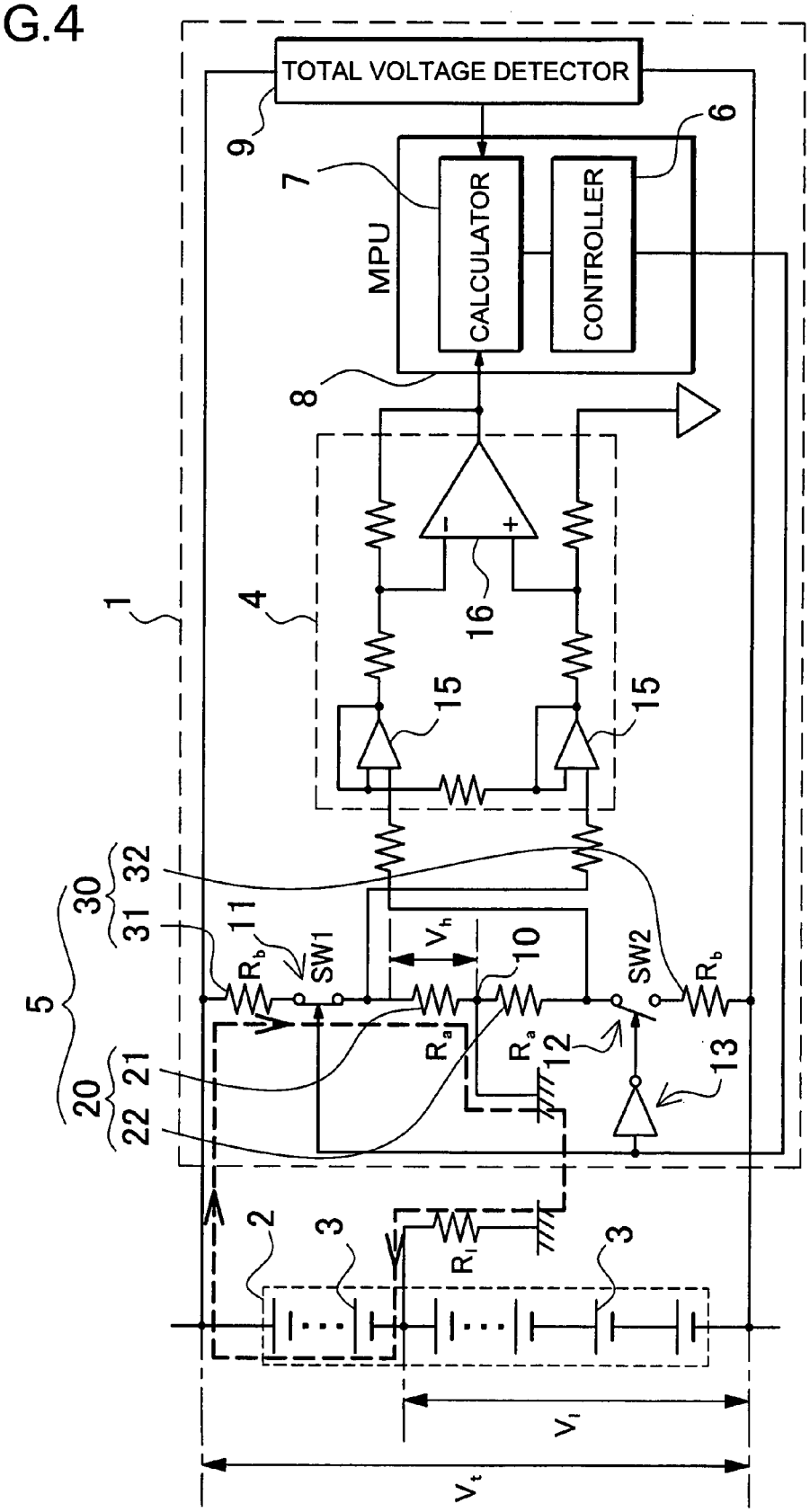
FIG. 4 is a diagram showing the state where the leakage detection circuit shown in FIG. 3 detects a first leakage voltage value.
Figure 5:
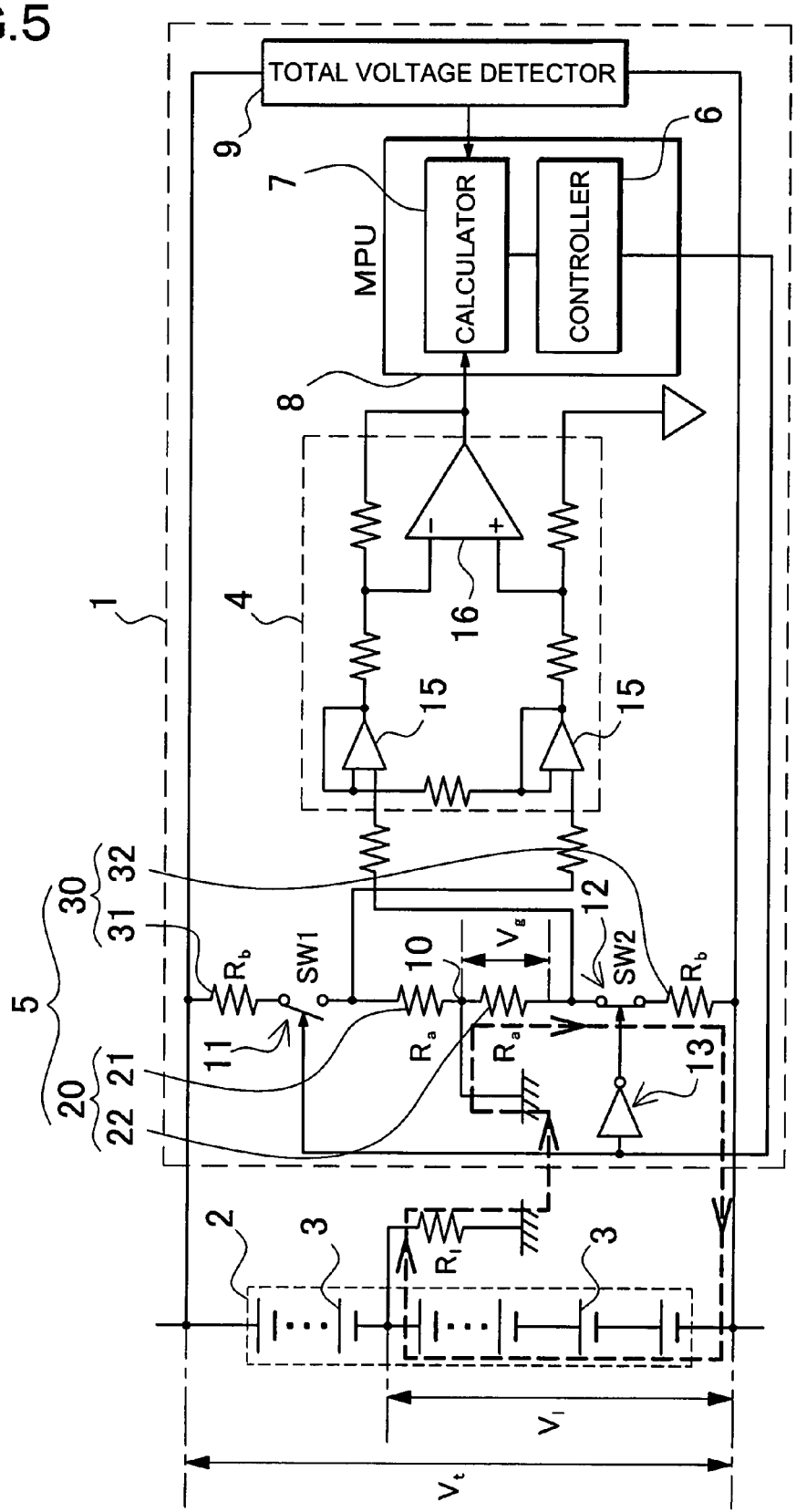
FIG. 5 is a diagram showing the state where the leakage detection circuit shown in FIG. 3 detects a second leakage voltage value.

In the aforementioned leakage detection circuit for an electric vehicle, as shown in FIG. 4, the controller 6 turns the first and second leakage detection switches 11 and 12 ON and OFF, respectively, to detects a first leakage voltage value of the leakage voltage values. On the other hand, as shown in FIG. 5, the controller 6 turns the first and second leakage detection switches 11 and 12 OFF and ON, respectively, to detect a second leakage voltage value of the leakage voltage values. The leakage detection circuit 1 shown in Figures detects a voltage value $V_h$ between the ends of the first voltage detection resistor 21 as the first leakage voltage value, and a voltage value $V_g$ between the ends of the second voltage detection resistor 22 as the second leakage voltage value. The calculator circuit 7 calculates the leakage resistance value $R_I$ based on the detected first and second leakage voltage values by using following Equation 3 to detect leakage. In the case where there is no leakage in the battery pack 2, the leakage resistance value $R_I$ is infinite. If the leakage resistance value $R_I$ is smaller than a predetermined resistance, the calculator 6 detects that leakage occurs. A display (not shown) displays a status of leakage. If leakage occurs, a contactor (not shown) that is connected to the output side of the battery pack 2 is turned OFF to cut off the output voltage to prevent harmful effects such as an electric shock.

$$R_I = \frac{R_a}{\frac{V_h(t_1)}{V_t(t_1)} + \frac{V_g(t_2)}{V_t(t_2)}} - (R_a + R_b) \qquad \text{Equation 3}$$

where $R_a$ is the resistance value of the first and second voltage detection resistors 21 and 22; $R_b$ is the resistance value of the first and second voltage dividing resistors 31 and 32; $V_{t(t1)}$ is the total voltage value of the battery pack at the timing t1 where the first and second leakage detection switches 11 and 12 are turned ON and OFF, respectively; $V_{h(t1)}$ is the first leakage voltage value that is generated in the first voltage detection resistor 21 at the timing t1; $V_{t(t2)}$ is the total voltage value of the battery pack at the timing t2 where the first and second leakage detection switches 11 and 12 are turned OFF and ON, respectively; and $V_{g(t1)}$ is the second leakage voltage value that is generated in the second voltage detection resistor 22 at the timing t2.

The procedure formulating the foregoing Equation 3 is now described. First, at the time t1, in the state where the first and second leakage detection switches 11 and 12 are turned ON and OFF, respectively, as shown in FIG. 4, when the first leakage voltage value $V_{h(t1)}$ that is generated in the first voltage detection resistor 21 is detected, following Equation 4 is satisfied. Equation 4 is derived based on that the differential voltage between the total voltage value $V_{t(t1)}$ as the high voltage side of the battery pack 2 and the voltage value $V_{I(t1)}$ at a leakage point is applied to a series circuit of the leakage resistance value $R_I$, the first voltage detection resistor 21 (resistance value $R_a$), and the first voltage dividing resistor 31 (resistance value $R_b$).

$$\frac{R_a}{R_I + R_a + R_b}(V_{t(t1)} - V_{I(t1)}) = V_{h(t1)} \qquad \text{Equation 4}$$

After that, at the time t2, in the state where the first and second leakage detection switches 11 and 12 are turned OFF and ON, respectively, as shown in FIG. 5, when the second leakage voltage value $V_{g(t2)}$ that is generated in the second voltage detection resistor 22 is detected, following Equation 5 is satisfied. Equation 5 is derived based on that the voltage value $V_{I(t2)}$ at the leakage point is applied to a series circuit of the leakage resistance value $R_I$, the second voltage detection resistor 22 (resistance value $R_a$), and the second voltage dividing resistor 32 (resistance value $R_b$).

$$\frac{R_a}{R_I + R_a + R_b} \cdot V_{I(t2)} = V_{g(t2)} \qquad \text{Equation 5}$$

In the case where the leakage point does not move when the first and second leakage detection switches 11 and 12 are alternately turned ON, following Equations 6 and 7 are satisfied.

$$V_{I(t1)} = kV_{t(t1)} \qquad \text{Equation 6}$$

$$V_{I(t2)} = kV_{t(t2)} \qquad \text{Equation 7}$$

Following Equations 8 and 9 are obtained by substituting Equations 6 and 7 into Equations 4 and 5.

$$\frac{R_a}{R_I + R_a + R_b}(1 - k)V_{t(t1)} = V_{h(t1)} \qquad \text{Equation 8}$$

$$\frac{R_a}{R_I + R_a + R_b} \cdot kV_{t(t2)} = V_{g(t2)} \qquad \text{Equation 9}$$

Equation 3 can be formulated based on these two Equations. The leakage resistance value $R_I$ of a high voltage line can be detected based on Equation 3. If leakage occurs at two or more points, a resistance value can be obtained as the equivalent parallel resistance value of leakage resistance values $R_I$ (shunt resistance). In addition, the leakage resistance value $R_I$ can be accurately detected in defiance of influence caused by voltage variation of the battery pack 2 that arises in a period of time during which the first and second leakage detection switches 11 and 12 are switched.

Figure 6:
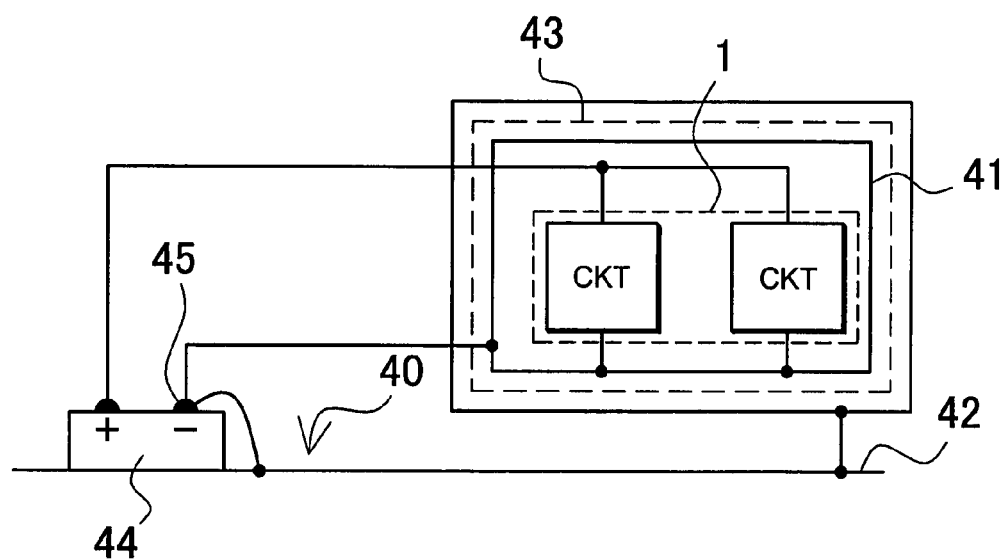
FIG. 6 is a schematic view showing the state where the leakage detection circuit is installed in a vehicle body.

FIG. 6 shows the state where the leakage detection circuit 1 is installed in a vehicle body 40. A negative terminal 45 of a 12-V lead-acid battery 44 for a vehicle acts as a ground portion of the power supply of the leakage detection circuit 1. The negative terminal 45 is typically connected to the vehicle body 40 at a point in proximity to a location on the vehicle body 40 where the lead-acid battery 44 is installed. In the leakage detection circuit according to the present invention, in the case where a line between a ground portion 41 of a circuit board 43 and a ground portion 42 of the body 40 is long, even if increase of the impedance between them introduces noise and the like, since the voltage detector amplifies only the voltage difference, leakage resistance detection accuracy is not affected. Therefore, it is possible to always accurately detect the leakage resistance.

The leakage detection circuit for an electric vehicle according to the present invention can be suitably applied to electric cars and hybrid cars.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims.

The present application is based on Application No. 2006-159335 filed in Japan on Jun. 8, 2006, the content of which is incorporated herein by reference.

What is claimed is:

1. A leakage detection circuit for an electric vehicle that detects electric vehicle battery pack leakage, the leakage detection circuit comprising:
   a battery pack including a plurality of batteries connected in series, the battery pack having a high voltage side and a low voltage side;
   first and second leakage detection switches connected to the high and low voltage sides of the battery pack, respectively;
   a controller that alternately turns the first and second leakage detection switches ON;
   a leakage detection resistor group having a midpoint and connected to the battery pack via the first and second leakage detection switches, the midpoint of the leakage detection resistor group being connected to the ground;
   a voltage detector that detects leakage voltage values in the leakage detection resistor group on the high and low voltage sides relative to the ground; and
   a calculator that calculates an output of the voltage detector and thus detects leakage,
   wherein
   the controller turns the first and second leakage detection switches ON and OFF, respectively, to detect a first leakage voltage value of the leakage voltage values, and turns the first and second leakage detection switches OFF and ON, respectively, to detect a second leakage voltage value of the leakage voltage values so that the calculator detects leakage based on the first and second leakage voltage values,
   wherein the leakage detection resistor group includes first and second voltage detection resistors and first and second voltage dividing resistors, wherein the first and second voltage detection resistors are connected in series, and a connection midpoint of the first and second voltage detection resistors is connected to the ground, wherein the first voltage dividing resistor joins the first voltage detection resistor to the high voltage side of the battery pack via the first leakage detection switch, and the second voltage dividing resistor joins the second voltage detection resistor to the low voltage side of the battery pack via the second leakage detection switch, and wherein a resistance value of the voltage dividing resistors is larger than a resistance value of the voltage detection resistors.

2. The leakage detection circuit for an electric vehicle according to claim 1, further comprising a total voltage detector that detects the total voltage value between the high and low voltage sides of the battery pack, wherein the calculator detects leakage based on the first and second leakage voltage values, and the total voltage value.

3. The leakage detection circuit for an electric vehicle according to claim 1, wherein the voltage detector detects the voltages of the first and second voltage detection resistors that are connected in series.

4. The leakage detection circuit for an electric vehicle according to claim 1, wherein the first and second voltage detection resistors have the same resistance value.

5. The leakage detection circuit for an electric vehicle according to claim 1, wherein the first and second voltage dividing resistors have the same resistance value.

6. The leakage detection circuit for an electric vehicle according to claim 1, wherein the high and low voltage side voltages are divided by the voltage dividing resistors and the voltage detection resistor, and the divided voltages are provided to the voltage detector.

7. The leakage detection circuit for an electric vehicle according to claim 1, wherein each of the first and second leakage detection switches is connected between each of the voltage dividing resistors and each of the voltage detection resistors.

8. The leakage detection circuit for an electric vehicle according to claim 1, wherein the first and second leakage detection switches are semiconductor switching devices.

9. The leakage detection circuit for an electric vehicle according to claim 1, wherein the first and second leakage detection switches are relays.

10. The leakage detection circuit for an electric vehicle according to claim 1, wherein an inverter that inverts ON/OFF control signals is connected on a control line that controls the second leakage detection switch, wherein the controller provides the ON control signal and thus turns the first and second leakage detection switches ON and OFF, respectively, and the controller provides the OFF control signal and thus turns the first and second leakage detection switches OFF and ON, respectively.

11. The leakage detection circuit for an electric vehicle according to claim 1, wherein the voltage detector includes buffer amplifiers connected to an input side, and a differential amplifier that detects the voltage difference between outputs of the buffer amplifiers.

12. The leakage detection circuit for an electric vehicle according to claim 1, wherein the calculator circuit detects a leakage resistance value $R_I$ based on the following equation $$R_I = \frac{R_a}{\frac{V_h(t_1)}{V_t(t_1)} + \frac{V_g(t_2)}{V_t(t_2)}} - (R_a + R_b)$$

where $R_a$ is the resistance value of first and second voltage detection resistors; $R_b$ is the resistance value of first and second voltage dividing resistors; $V_{t(t1)}$ is the total voltage value of the battery pack at the timing t1 where the first and second leakage detection switches are turned ON and OFF, respectively; $V_{h(t1)}$ is the first leakage voltage value that is generated in the first voltage detection resistor at the timing t1; $V_{t(t2)}$ is the total voltage value of the battery pack at the timing t2 where the first and second leakage detection switches are turned OFF and ON, respectively; and $V_{g(t1)}$ is the second leakage voltage value that is generated in the second voltage detection resistor at the timing t2.

13. The leakage detection circuit for an electric vehicle according to claim 12, wherein a total voltage detector that detects the output voltage of the battery pack detects the total voltage value of the batteries.

14. The leakage detection circuit for an electric vehicle according to claim 12, wherein the calculator detects that leakage occurs when detecting that the leakage resistance value $R_I$ is smaller than a predetermined resistance.

15. An electric vehicle having a leakage detection circuit according to claim 1.

* * * * *